United States Patent
Kindl et al.

(10) Patent No.: US 12,471,381 B2
(45) Date of Patent: Nov. 11, 2025

(54) RECTIFIER DEVICE WITH MINIMIZED LATERAL COUPLING

(71) Applicant: Infineon Technologies AG, Neubiberg (DE)

(72) Inventors: Benedikt Kindl, Wackersdorf (DE); Juliane Laurer, Regensburg (DE); Max Stelzer, Regensburg (DE); Vadim Valentinovic Vendt, Munich (DE)

(73) Assignee: Infineon Technologies AG, Neubiberg (DE)

( * ) Notice: Subject to any disclaimer, the term of this patent is extended or adjusted under 35 U.S.C. 154(b) by 557 days.

(21) Appl. No.: 17/941,901

(22) Filed: Sep. 9, 2022

(65) Prior Publication Data

US 2024/0088130 A1    Mar. 14, 2024

(51) Int. Cl.
*H10D 89/60*     (2025.01)
*H01L 23/522*     (2006.01)
*H01L 23/528*     (2006.01)

(52) U.S. Cl.
CPC .......... *H10D 89/60* (2025.01); *H01L 23/528* (2013.01); *H01L 23/5226* (2013.01)

(58) Field of Classification Search
CPC ................... H01L 23/4824; H10D 89/611
See application file for complete search history.

(56) References Cited

U.S. PATENT DOCUMENTS

| | | | |
|---|---|---|---|
| 7,525,779 B2 | 4/2009 | Chen et al. | |
| 10,672,758 B2 | 6/2020 | Vendt et al. | |
| 11,011,509 B2 | 5/2021 | Zeng et al. | |
| 11,776,996 B2 | 10/2023 | Tylaite et al. | |
| 2001/0012671 A1* | 8/2001 | Hoshino | H10D 84/0149 438/303 |
| 2009/0073621 A1 | 3/2009 | Thijs et al. | |
| 2011/0018129 A1* | 1/2011 | Suzuki | H01L 24/17 257/737 |
| 2011/0042747 A1 | 2/2011 | Galy et al. | |
| 2013/0153957 A1 | 6/2013 | Lin et al. | |
| 2014/0327042 A1 | 11/2014 | Morishita | |
| 2014/0339603 A1 | 11/2014 | Kuo et al. | |
| 2015/0371941 A1* | 12/2015 | Nakaiso | H10D 89/611 257/499 |

(Continued)

FOREIGN PATENT DOCUMENTS

WO    2013074254 A1    5/2013

*Primary Examiner* — Evren Seven
(74) *Attorney, Agent, or Firm* — Murphy, Bilak & Homiller, PLLC

(57) ABSTRACT

A semiconductor device includes a semiconductor body having an upper surface, a group of first upper-level metal fingers and second upper-level metal fingers that are arranged alternatingly with one another, wherein each of the first upper-level metal fingers is electrically connected to the semiconductor body by the first lower-level conductive fingers, wherein each of the second upper-level metal fingers is electrically connected to the semiconductor body by the second lower-level conductive fingers, wherein the group of first lower-level conductive fingers and second lower-level conductive fingers defines a connection area over the upper surface, and wherein in the connection area the first upper-level metal fingers are at least partially non-overlapping with the second upper-level metal fingers.

13 Claims, 5 Drawing Sheets

(56) References Cited

U.S. PATENT DOCUMENTS

| | | | |
|---|---|---|---|
| 2016/0118490 A1* | 4/2016 | Padmanabhan | H10D 62/378 |
| | | | 257/195 |
| 2016/0343701 A1 | 11/2016 | Zhong et al. | |
| 2017/0098645 A1* | 4/2017 | Su | H10D 89/611 |
| 2017/0271319 A1* | 9/2017 | Schmitt | H01L 23/535 |
| 2018/0108648 A1 | 4/2018 | Vendt et al. | |
| 2019/0051645 A1* | 2/2019 | Sasaki | H10D 10/821 |
| 2020/0075575 A1 | 3/2020 | Sharma | |
| 2020/0126730 A1 | 4/2020 | Puerstinger | |
| 2020/0411510 A1* | 12/2020 | Sharma | H10D 89/611 |
| 2021/0234516 A1* | 7/2021 | Schultz | H03F 1/02 |
| 2023/0049774 A1* | 2/2023 | Song | H10D 89/921 |
| 2023/0386978 A1* | 11/2023 | Kuroda | H01L 23/4952 |
| 2024/0153944 A1* | 5/2024 | Osumi | H10D 84/00 |
| 2025/0006726 A1* | 1/2025 | Domanski | H10D 1/47 |

* cited by examiner

RECTIFIER DEVICE WITH MINIMIZED LATERAL COUPLING

TECHNICAL FIELD

The instant application relates to semiconductor devices, and more particularly to rectifier devices.

BACKGROUND

Components such as transistors, diodes, resistors, electro-optical devices, precision film resistors and a variety of integrated circuits are all sensitive to electrostatic discharge (ESD). As electronics manufacturers drive to miniaturize devices and improve operating speeds, susceptibility of devices to ESD is increasing. For avoiding damage to integrated circuits or electronic devices by pulses during assembly or operation, ESD protection devices are connected between pins of an integrated circuit or between traces on a printed circuit board in order to prevent a malfunction or breakdown of circuits connected between the pins or traces by ESD current pulses. One type of ESD protection device is a rectifier device that can be used to shunt a damaging ESD current and otherwise allow a sensitive device to operate within safe voltage levels. In high frequency applications, such a protection device should have very low capacitance to minimize insertion loss and improve linearity. It is therefore desirable to provide a rectifier device with low parasitic capacitance.

SUMMARY

Those skilled in the art will recognize additional features and advantages upon reading the following detailed description, and upon viewing the accompanying drawings.

A semiconductor device is disclosed. According to an embodiment, the semiconductor device comprises a semiconductor body comprising an upper surface, a group of first lower-level conductive fingers and second lower-level conductive fingers that disposed on or above the upper surface and are arranged alternatingly with one another in a first lateral direction; and a group of first upper-level metal fingers and second upper-level metal fingers that are arranged alternatingly with one another in the first lateral direction, wherein each of the first upper-level metal fingers is electrically connected to the semiconductor body by first vertical connectors that comprise one of the first lower-level conductive fingers, wherein each of the second upper-level metal fingers is electrically connected to the semiconductor body by second vertical connectors that comprise one of the second lower-level conductive fingers, wherein the group of first lower-level metal fingers and second lower-level metal fingers defines a connection area over the upper surface, and wherein in the connection area the first upper-level metal fingers are at least partially non-overlapping with the second upper-level metal fingers in the first lateral direction.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A illustrates the semiconductor device from a cross-sectional perspective; and FIG. 1B illustrates the semiconductor device from a plan-view perspective.

DETAILED DESCRIPTION

Embodiments of semiconductor device that can be configured as a rectifier for ESD protection are described herein. The layout of the device advantageously provides an advantageously low parasitic capacitance. The semiconductor device comprises a plurality of p-type regions and n-type regions that are formed within a semiconductor body. These p-type regions and n-type regions are arranged alternatingly with one another and form the active regions of the device. The electrical connections between the terminals of the semiconductor device and the p-type regions and n-type regions are effectuated by upper-level metal fingers. The upper-level metal fingers extend into a connection area whereby vertical connection to the subjacent p-type regions and n-type regions can be effectuated. An advantageously low parasitic capacitance is realized by configuring the upper-level metal fingers to be at least partially non-overlapping with one another in the connection area. This reduces cross-coupling of the upper-level metal fingers themselves as well as subjacent through-vias in the connection area.

Figures 1, 1A:
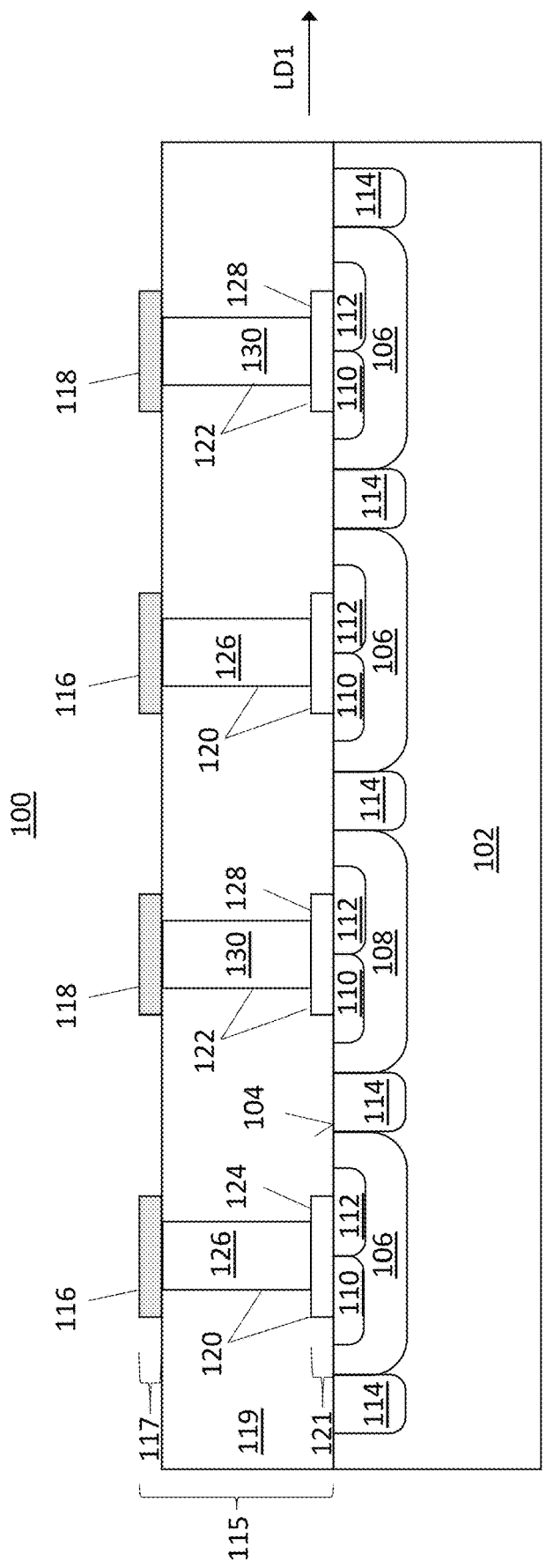
FIG. 1, which includes
FIGS. 1A and 1B, illustrates a semiconductor device, according to an embodiment.

Referring to FIG. 1A, a semiconductor device 100 comprises a semiconductor body 102 comprising an upper surface 104. Generally speaking, the semiconductor body 102 may comprise or consist of a semiconductor material from group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

The semiconductor device 100 comprises a group of p-type regions 106 and n-type regions 108. The p-type regions 106 and the n-type regions 108 extend from the upper surface 104 into the semiconductor body 102. The p-type regions 106 and the n-type regions 108 are arranged alternatingly with one another in a first lateral direction LD1 that is parallel to the upper surface 104 of the semiconductor body 102. That is, the p-type regions 106 and the n-type regions 108 are arranged such that a line extending in the first lateral direction LD1 intersects one of the p-type regions 106, followed by one of the n-type regions 108, followed by one of the p-type regions 106, and so forth. The p-type regions 106 and the n-type regions 108 can be doped wells that are formed by implanting and diffusing dopant atoms into the upper surface 104 of the semiconductor body 102, for example.

According to an embodiment, the semiconductor device 100 comprises shallow p-type regions 110 and shallow n-type regions 112 disposed within each of the n-type regions 108 and the p-type regions 106. The shallow p-type regions 110 and the shallow n-type regions 112 can be doped wells that are formed by a second doping process of implanting and diffusing dopant atoms into the upper surface 104 of the semiconductor body 102, for example The background dopant concentration of the semiconductor body 102 can be a lightly doped n-type or p-type net dopant concentration in the range of $10^{11}$ dopant atoms/cm$^3$ to $10^{15}$ dopant atoms/cm$^3$. The p-type regions 106 and the n-type regions 108 may have a higher dopant concentration than the background dopant concentration of the semiconductor body 102. For example, the n-type wells 108 may each have a dopant concentration of at least $10^{15}$ dopant atoms/cm$^3$ and more typically in the range of $10^{17}$ dopant atoms/cm$^3$. The shallow p-type regions 110 and the shallow n-type regions 112 may a higher dopant concentration than the p-type regions 106 and the n-type regions 108. For example, the shallow p-type regions 110 and the shallow n-type regions 112 may each have a dopant concentration of least $10^{18}$ dopant atoms/cm$^3$ and more typically in the range of $10^{19}$ dopant atoms/cm$^3$ to $10^{21}$ dopant atoms/cm$^3$.

According to an embodiment, the semiconductor device 100 comprises isolation regions 114 that extend from the upper surface 104 into the semiconductor body 102 and are arranged between the p-type regions 106 and the n-type regions 108. As shown, the isolation regions 114 may extend to a similar or identical depth as the p-type regions 106 and the n-type regions 108. The isolation regions 114 may comprise electrically insulating materials such as oxides, nitrides, oxynitrides, and more particularly SiO$_2$ (silicon dioxide), SiN (silicon nitride), SiOxNy (silicon oxynitride) in the case of a silicon or silicon-based semiconductor body 102. According to an embodiment, the isolation regions 114 are so-called shallow trench isolation (STI) regions. In that case, the isolation regions 114 can be disposed within a trench that is formed in the upper surface 104.

Figure 4:
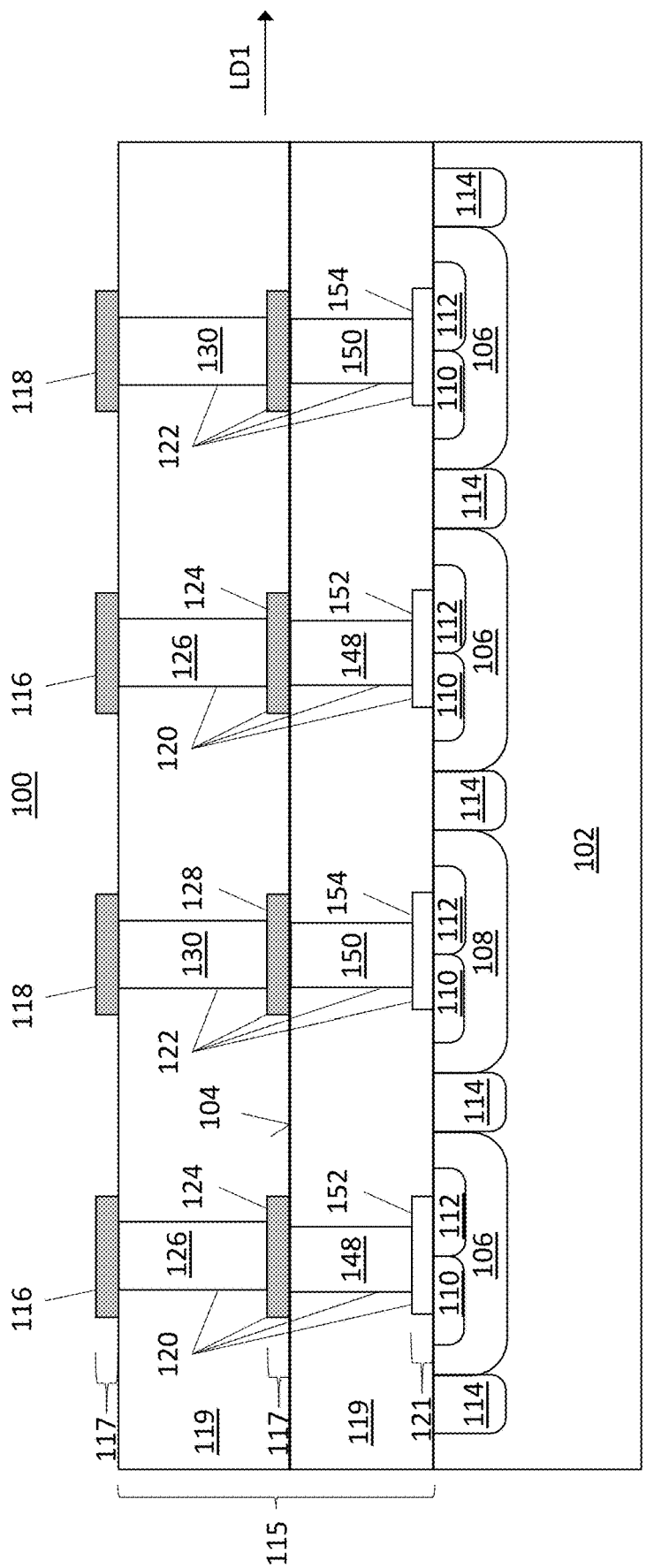
FIG. 4 illustrates a semiconductor device from a cross-sectional perspective, according to an embodiment.

The semiconductor device 100 comprises an interconnection region 115 disposed on the upper surface 104 of the semiconductor body 102. The interconnection region 115 comprises one or more structured metallization layers 117 and an interlayer dielectric region 119 arranged between the one or more structured metallization layers 117 and the upper surface 104 of the semiconductor body 102. The structured metallization layer 117 may comprise an electrically conductive metal, e.g., copper, aluminum, nickel, and alloys thereof. The dielectric regions 119 may comprise electrically insulating materials such as oxides, nitrides, oxynitrides, and more particularly SiO$_2$ (silicon dioxide), SiN (silicon nitride), SiOxNy (silicon oxynitride) in the case of a silicon or silicon-based semiconductor body 102. While the figures represent the dielectric region 119 as a single region, the dielectric region 119 may comprise multiple regions or layers of dielectric material that are compositionally different and/or formed by different techniques, e.g., passivation layers, barrier layers, high-density plasma (HDP) formed regions, TEOS (tetraethoxysilane) formed regions, etc. In the embodiment of FIG. 1, the interconnection region 115 includes one structured metallization layer 117 and one interlayer dielectric region 119 arranged between the structured metallization layer 117 and the upper surface 104. More generally, the semiconductor device 100 may comprise multiple levels of structured metallization layers 117 stacked on top of one another and an interlayer dielectric region 119 interposed between each level of structured metallization layer 117, an example of which is illustrated in FIG. 4 and discussed in further detail below.

The semiconductor device 100 comprises a group of first upper-level metal fingers 116 and second upper-level metal fingers 118. The first upper-level metal fingers 116 and the second upper-level metal fingers 118 are arranged alternatingly with one another in the first lateral direction LD1 in a similar manner as the p-type regions 106 and the n-type regions 108. The first upper-level metal fingers 116 and the second upper-level metal fingers 118 are formed in one of the structured metallization layers 117 of the interconnection region 115. In the embodiment of FIG. 1, the first upper-level metal fingers 116 and the second upper-level metal fingers 118 are formed in the structured metallization layer 117 that corresponds to a second level metallization layer of the semiconductor device 100. In this context, the "first level" corresponds to an interconnection level that is disposed on the upper surface 104 itself and the "second level" corresponds to the next interconnection level that is above and spaced apart from the upper surface 104. In the embodiment of FIG. 1, second level metallization layer is also the only metallization layer 117 such that the first upper-level metal fingers 116 and the second upper-level metal fingers 118 are formed in an uppermost metallization layer of the semiconductor device 100. The interconnection region 115 may additionally comprise an electrically insulating layer, such as a passivation layer (not shown) that covers and protects the first upper-level metal fingers 116 and the second upper-level metal fingers 118.

The first upper-level metal fingers 116 and the second upper-level metal fingers 118 are electrically connected the semiconductor body 102 by first vertical connectors 120 and second vertical connectors 122, respectively. The first upper-level metal fingers 116 and the second upper-level metal fingers 118 are at different potentials from one another. According to an embodiment, the first upper-level metal fingers 116 are electrically connected to the p-type regions 106 by the first vertical connectors 120 and the second upper-level metal fingers 118 are electrically connected the n-type regions 108 by the second vertical connectors 122. The first and second vertical connectors 120, 122 are provided by a combination of electrically conductive elements that occupy the vertical space between the first and second upper-level metal fingers 116, 118 and the p-type and n-type regions, 106, 108, respectively.

According to an embodiment, the first vertical connectors 120 comprise first lower lower-level conductive fingers 124 that are disposed below the first upper-level metal fingers 116 and first though-vias 126 that extend between the first lower lower-level conductive fingers 124 and the first upper-level metal fingers 116. The second vertical connectors 122 comprise second lower lower-level conductive fingers 128 that are disposed below the second upper-level metal fingers 118 and second though-vias 130 that extend between the second lower lower-level conductive fingers 126 and the second upper-level metal fingers 118. In the embodiment of FIG. 1, the first lower lower-level conductive fingers 124 are in ohmic contact with the p-type regions 106 and the second lower lower-level conductive fingers 128 are in ohmic contact with the n-type regions 108, respectively. In the embodiment of FIG. 1, the first though-vias 126 are in ohmic contact with the first upper-level metal fingers 116 and the first lower lower-level conductive fingers 124 and the second though-vias 130 are in ohmic contact with the second upper-level metal fingers 118 and the second lower lower-level conductive fingers 128, respectively.

According to the embodiment of FIG. 1, the first lower-level conductive fingers 124 and the second lower-level conductive fingers 128 are formed in a substrate level interconnect layer 121. The substrate level interconnect layer 121 is a first level interconnect layer that is formed directly on the upper surface 104 of the semiconductor body 102 before forming the interconnection region 115. The substrate level conductive layer 121 may be a metal layer comprising, e.g., copper, aluminum, nickel, tungsten, and alloys thereof. Alternatively, the substrate level conductive layer 121 may comprise polycrystalline material, e.g., polysilicon, or a metal silicide, e.g., copper silicide, nickel silicide, etc. The first through-vias 126 and the second though-vias 130 may be formed in trenches that extend through the interlayer dielectric region 119 and are filled with conductive material, e.g., tungsten, nickel, copper, aluminum, etc.

Figures 1, 1B:
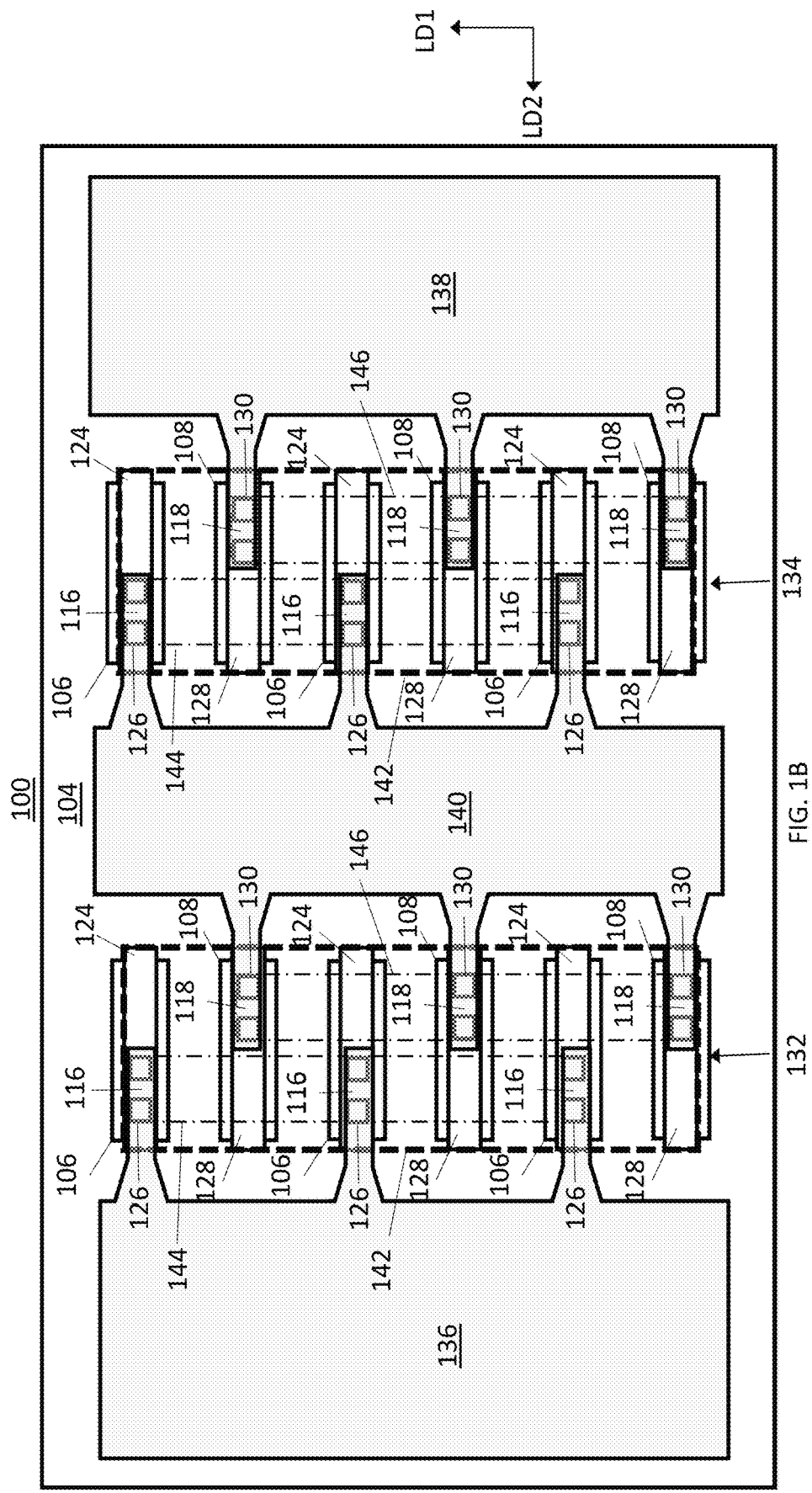

Referring to FIG. 1B, the semiconductor device 100 is shown from a plan-view perspective, according to an embodiment. In this view, the outer boundaries of vertically spaced apart features are superimposed on another for illustration purposes. Moreover, the dielectric region 119 and the isolation regions 114 shown in FIG. 1 have been omitted for illustration purposes.

The semiconductor device 100 comprises first and second groups 132, 134 of the p-type regions 106 and n-type regions 108 that are arranged alternatingly with one another in the first lateral direction LD1. As shown, the p-type regions 106 and the n-type regions 108 may have an elongated rectangle geometry. An elongated rectangle geometry refers to a geometry with two elongated sides that run parallel to one another and two shorter sides that run parallel to one another and perpendicular to the elongated sides. The shorter sides of the p-type regions 106 and the n-type regions 108 may run parallel to the first lateral direction LD1 and may be aligned with one another. The elongated sides of the p-type regions 106 and the n-type regions 108 may run parallel to a second lateral direction LD2 that is perpendicular to first lateral direction LD1 and the upper surface 104. Moreover, the p-type regions 106 and the n-type regions 108 may have the same elongated rectangle geometry, meaning that the dimensions of each region are identical to one another. The first lower-level conductive fingers 124 and the second lower-level conductive fingers 128 may also have an elongated rectangle geometry. While the figure shows the first lower-level conductive fingers 124 and the second lower-level conductive fingers 128 being slightly narrower than the underlying p-type regions 106 and the n-type regions 108, respectively, in the first lateral direction LD1 and slightly wider than the underlying p-type regions 106 and the n-type regions 108, respectively, in the second lateral direction LD2, other geometries are possible. For example, the first lower-level conductive fingers 124 and the second lower-level conductive fingers 128 may have outer sides that are coextensive with any or all sides of the underlying p-type regions 106 and the n-type regions 108, respectively.

The semiconductor device 100 comprises a first contact pad 136, a second contact pad 138 and a central interconnect pad 140. The first contact pad 136 is electrically connected to the p-type regions 106 in the first group 132 by the first upper-level metal fingers 116. The central interconnect pad 140 is electrically connected to the n-type regions 108 in the first group 132 by the second upper-level metal fingers 118 and is electrically connected to the p-type regions 106 in the second group 134 by the first upper-level metal fingers 116. The second contact pad 138 is electrically connected to the n-type regions 108 in the second group 134 by the second upper-level metal fingers 118. As shown, each of the first contact pad 136, the second contact pad 138 and the central interconnect pad 140 may be formed in the same structured metallization layer 117 as the first and second upper-level metal fingers 116, 118. Alternatively, the first contact pad 136, the second contact pad 138 and the central interconnect pad 140 may be formed in a different level metallization layer 117 and connected to the level of the first and second upper-level metal fingers 116, 118 by through-via connections. Separately or in combination, the first contact pad 136 and the second contact pad 138 can be formed in an uppermost metallization layer 117 and can therefore be configured as externally accessible bond pads.

The working principle of the semiconductor device 100 is as follows. The semiconductor device 100 is a lateral device, meaning that it is configured to conduct or block a current flowing parallel to the upper surface 104 of the semiconductor body 102 as between the first contact pad 136 and the second contact pad 138. The shallow p-type regions 110 in the p-type regions 106 form an ohmic connection between the first vertical connectors 120 and the p-type regions 106, while the shallow n-type regions 112 in the p-type regions 106 form a rectifying p-n junction connection between the first vertical connectors 120 and the p-type regions 106. Correspondingly, shallow n-type regions 112 in the n-type regions 108 form an ohmic connection between the second vertical connectors 122 and the n-type regions 108, while the shallow p-type regions 110 in the n-type regions 108 form a rectifying p-n junction connection between the second vertical connectors 122 and the n-type regions 108. The first and second groups 132, 134 of the p-type regions 106 and n-type regions 108, with each region comprising the shallow p-type regions 110 and shallow n-type regions 112, collectively form two rectifier devices connected in an anti-series configuration between the first contact pad 136 and the second contact pad 138. For positive voltages, the rectifier devices are configured as an SCR (silicon controlled rectifier) device, i.e., a PNPN structure or thyristor. For negative voltages, these structures are configured as a forward biased p-i-n diode. The device 100 is symmetric and bidirectional as between the first contact pad 136 and the second contact pad 138. The semiconductor device 100 may comprise trigger regions (not shown) between the n-type regions 108 and the p-type regions 106 that interrupt the isolation region 114 and are create a locally reduced breakdown voltage between the p-type regions 106 and the n-type regions 108, which can place the device into a conduction state. Once the device is in the conduction state, a three-dimensional current flows from the n-type regions 108 to the p-type regions 106 underneath the isolation regions 114. Most of this three-dimensional current flows in the direction from the n-type regions 108 to the p-type regions 106, with less current flowing in the opposite direction. This device concept can be used to form a low-ohmic current path that shunts a sudden and large current, e.g., from an ESD event, away from another device that is connected in parallel with the first contact pad 136 and the second contact pad 138.

Instead of a so-called SCR structure as described above, the semiconductor device 100 can be any type of device that has the basic arrangement of the n-type regions 108 and p-type regions 106 as disclosed herein, i.e., comprises a group of p-type regions 106 and n-type regions 108 that are arranged alternatingly with one another, and is configured to rectify a signal between first and second terminals. For instance, the semiconductor device 100 may be configured as a p-n junction diode by omitting the second group 134 of the p-type regions 106 and n-type regions 108 and converting the central interconnect pad 140 to a device terminal. Separately or in combination, the semiconductor device 100 can be configured as a unidirectional device, e.g., by omitting the shallow n-type regions 112 from the p-type regions 106 and by omitting the shallow p-type regions 110 from the n-type regions 108. Separately or in combination, the isolation regions 114 may be omitted and/or the n-type regions 108 and the p-type regions 106 may form a direct p-n junction with one another.

The first lower-level conductive fingers 124 and the second lower-level conductive fingers 128 define a connection area 142 over the upper surface 104. The connection area 142 refers to a two-dimensional region that is defined by the outer boundaries of the first lower-level conductive fingers 124 and the second lower-level conductive fingers 128. Thus, the connection area 142 comprises two opposite facing sides that are coextensive with the outer ends of each of the first lower-level conductive fingers 124 and the second lower-level conductive fingers 128 and two opposite facing sides that are coextensive with outer sides from the two outermost ones of the first lower-level conductive fingers 124 and the second lower-level conductive fingers 128. Vertical overlap between the first and second upper-level conductive fingers 116, 118 and the first lower-level conductive fingers 124 and the second lower-level conductive fingers 128 occurs in the connection area 142. The first upper-level metal fingers 116 enter the connection area 142 from one side and the second upper-level metal fingers 118 enter the connection area 142 from an opposite side.

The semiconductor device 100 is configured such that the first upper-level metal fingers 116 are at least partially non-overlapping with the second upper-level metal fingers 118 in the first lateral direction LD1 in the connection area 142. This means that there exists one cross-sectional plane extending in the first lateral direction LD1 that intersects each of the first upper-level metal fingers 116 but not the second upper-level metal fingers 118 and another cross-sectional plane extending in the first lateral direction LD1 that intersects each of the second upper-level metal fingers 118 but not the first upper-level metal fingers 116. Stated another way, the first upper-level metal fingers 116 are receded from one side of the connection area 142 and the second upper-level metal fingers 118 are receded from another side of the connection area 142. In doing so, in the connection area 142, the first upper-level metal fingers 118 are partially non-overlapping with the first lower-level conductive fingers 120 in the second lateral direction LD2 and the second upper-level metal fingers 118 are partially non-overlapping with the second lower-level conductive fingers 128 in the second lateral direction LD2.

By arranging the first upper-level metal fingers 116 and the second upper-level metal fingers 118 to be partially non-overlapping with one another within the connection area 142, the lateral capacitive coupling between the first upper-level metal fingers 116 and the second upper-level metal fingers 118 can be minimized. That is, the effective area of metal from the first upper-level metal fingers 116 that is immediately opposite from the second upper-level metal fingers 118 is lowered, thereby limiting the capacitive effect of these structures. By way of comparison, in an arrangement whereby the first upper-level metal fingers 116 and the second upper-level metal fingers 118 completely overlap with one another, i.e., extend completely across the width of the connection area 142, there is a greater effective length of overlapping conductors and hence greater capacitance.

According to an embodiment, the semiconductor device 100 is configured such that the first upper-level metal fingers 116 are completely non-overlapping with the second upper-level metal fingers 118 in the first lateral direction LD1 in the connection area 142. A completely non-overlapping configuration refers to a configuration wherein there is no overlap or essentially no overlap between the first and second upper-level metal fingers 118. FIG. 1B illustrates one such configuration. As shown, the first upper-level metal fingers 116 may each be configured to extend across one half of the connection area 142 and terminate at a plane that bisects the connection area 142 in the first lateral direction LD1. A configuration wherein there is essentially no overlap refers to an arrangement wherein the ends of the first upper-level metal fingers 116 and the second upper-level metal fingers 118 nominally terminate at the same plane, e.g., as shown in FIG. 1B. In practice, non-conformity with a nominal shape due to processing tolerances may result in slight overlap. In another embodiment (not shown) wherein the first upper-level metal fingers 116 are completely non-overlapping with the second upper-level metal fingers 118 in the first lateral direction LD1 in the connection area 142, an intentional separation distance may be provided such that outer ends of the first upper-level metal fingers 116 are spaced apart from outer ends of the second upper-level metal fingers 118 in the second lateral direction LD2. That is, the first upper-level metal fingers 116 and the second upper-level metal fingers 118 are intentionally formed such that there is a region in the center of the connection area 142 whereby a cross-sectional plane extending in the first lateral direction LD1 does not intersect either one of the first and second upper-level metal fingers 118. This configuration provides further separation distance between the first upper-level metal fingers 116 and the second upper-level metal fingers 118 that are closest to one another, thus reducing lateral capacitive coupling.

According to an embodiment, all of the first though-vias 126 in the connection area 142 are confined within a first through-via area 144, all of the second though-vias 130 in the connection area 142 are confined within a second through-via area 146, and the first through-via area 144 is non-overlapping with the second through-via area 146 in the first lateral direction LD1. The first through-via area 144 refers to a sub-region of the connection area 142 that is defined by the outer boundaries of all through-vias that ohmically contact the first upper-level metal fingers 116. The second through-via area 146 refers to a sub-region of the connection area 142 that is defined by the outer boundaries of all through-vias that ohmically contact the second upper-level metal fingers 118. In a non-overlapping arrangement, there is no overlap or essentially no overlap between the first through-via area 144 and the second through-via area 146. FIG. 1 illustrates one such configuration wherein the first and second through-via areas 144, 146 are completely non-overlapping. By arranging the through-vias to be non-overlapping in this way, the lateral capacitive coupling between the through-vias can be minimized, and thus the parasitic capacitance of the device can be improved in a similar manner as described above.

Figure 2:
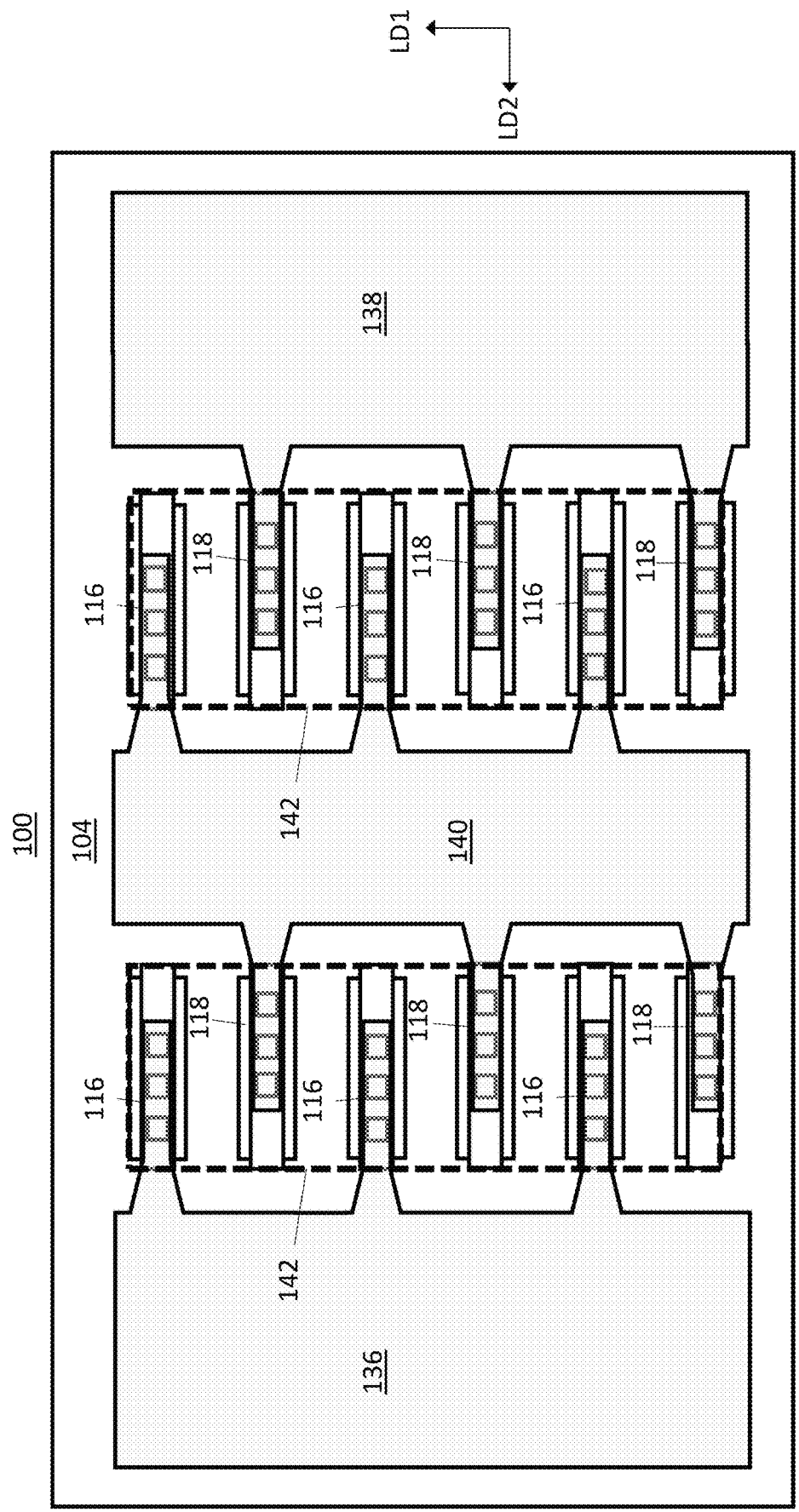
FIG. 2 illustrates a semiconductor device from a plan-view perspective, according to an embodiment.

Referring to FIG. 2, the semiconductor device 100 is shown from a plan-view perspective, according to another embodiment. In this embodiment, the first upper-level metal fingers 116 are partially non-overlapping with the second upper-level metal fingers 118 in the first lateral direction LD1 in the connection area 142. While the partially non-overlapping arrangement increases the lateral capacitive coupling between the first upper-level metal fingers 116 and the second upper-level metal fingers 118 in comparison to a completely non-overlapping configuration, the arrangement nevertheless provides reduced capacitance in comparison to a completely overlapping configuration. Moreover, by increasing the overlap area between the upper-level metal fingers and the lower-level metal fingers, the partially non-overlapping configuration may allow for an increased number of through-vias to contact each of the first upper-level metal fingers 116 and the second upper-level metal fingers 118.

An overlap ratio of the first upper-level metal fingers 116 and the second upper-level metal fingers 118 in the connection area 142 can be selected to balance various considerations, e.g., lateral capacitive coupling, through-via connections, manufacturability, etc. The overlap ratio is a ratio between a combined length of the first upper-level metal fingers 116 that overlap with the second upper-level metal fingers 118 in the connection area 142 and a combined length of the first upper-level metal fingers 116 that do not overlap with the second upper-level metal fingers 118 in the connection area 142. According to an embodiment, the overlap ratio of the first upper-level metal fingers 116 and the second upper-level metal fingers 118 in the connection area 142 is no more than 25%. In other embodiments, the overlap ratio of the first upper-level metal fingers 116 and the second upper-level metal fingers 118 in the connection area 142 can be no more than 75%, no more than 50%, no more than 30%, no more than 20%, or no more than 10%.

Figure 3:
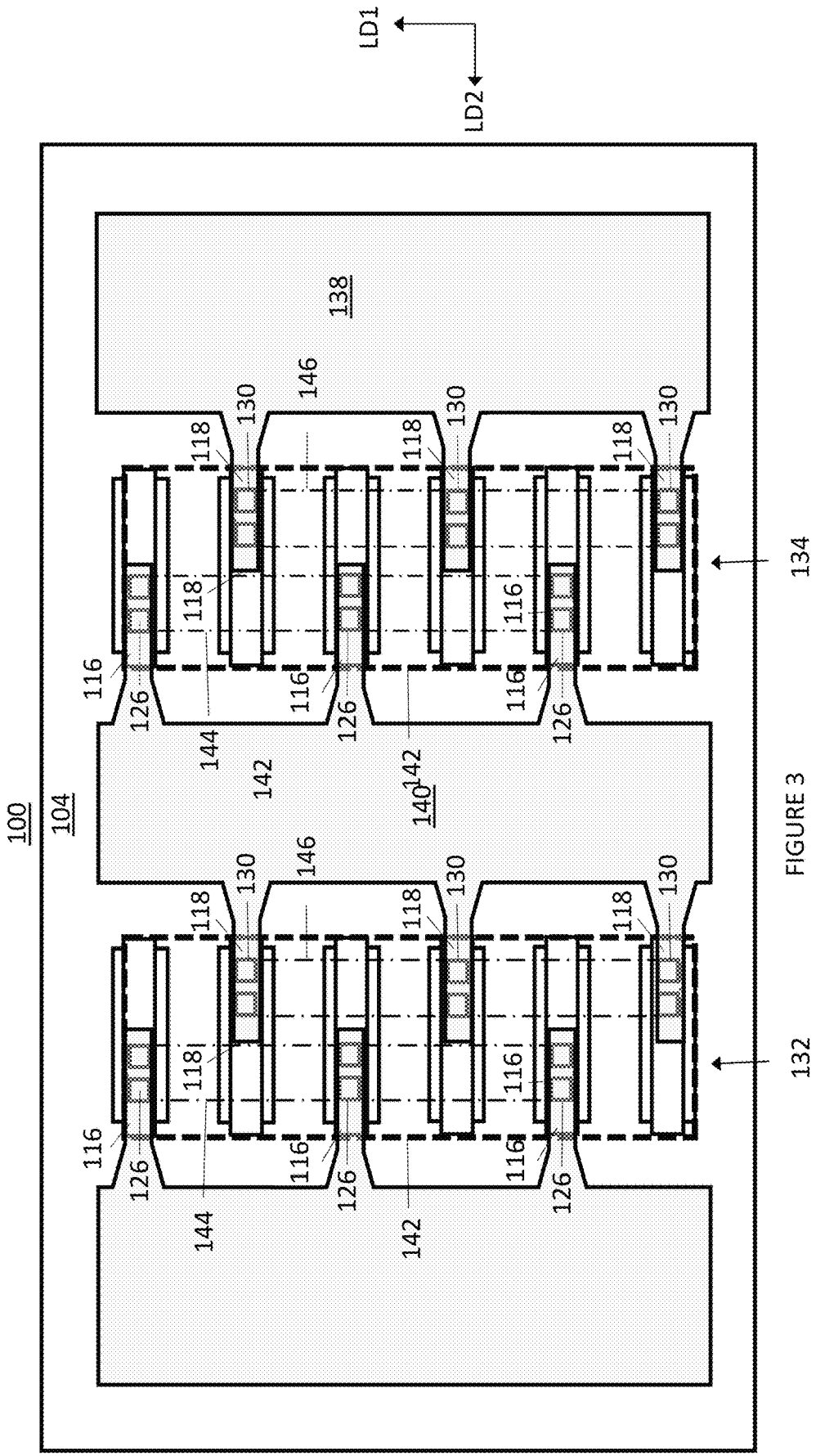
FIG. 3 illustrates a semiconductor device from a plan-view perspective, according to an embodiment.

Referring to FIG. 3, the semiconductor device 100 is shown from a plan-view perspective, according to another embodiment. Similar to the embodiment of FIG. 2, in this embodiment the first upper-level metal fingers 116 are partially non-overlapping with the second upper-level metal fingers 118 in the first lateral direction LD1 in the connection area 142. However, different to the embodiment of FIG. 2, in this embodiment the first through-via area 144 is non-overlapping with the second through-via area 146 in the first lateral direction LD1. Thus, the embodiment of FIG. 3 advantageously mitigates lateral capacitive coupling between the through-vias in a similar manner as previously described. As can be seen, a non-overlapping arrangement of the first through-via area 144 and the second through-via area 146 can be obtained with a slight amount of overlap between the first upper-level metal fingers 116 and the second upper-level metal fingers 118 in the first lateral direction LD1, e.g., an overlap ratio of less than about 10%.

Referring to FIG. 4, the semiconductor device 100 is shown from a cross-sectional perspective, according to an embodiment. Different to the embodiment of FIG. 1, the interconnection region 115 comprises of two of the structured metallization layers 117. The first upper-level metal fingers 116 and the second upper-level metal fingers 118 are formed in structured metallization layer 117 that corresponds to a third level metallization layer. The first lower-level conductive fingers 124 and the second lower-level conductive fingers 128 are formed in structured metallization layer 117 that corresponds to a second level metallization layer. The first vertical connectors 120 additionally comprise first substrate-level conductive fingers 152 that are in ohmic contact with the p-type regions 106 and first lower level through-vias 148 that extend between the first substrate-level conductive fingers 152 and the first lower-level conductive fingers 124. The geometry of the first and second substrate-level conductive fingers 152, 154 may be identical to that of the first and second lower-level conductive fingers 124, 128. However, this is not necessary. The second vertical connectors 122 additionally comprise second substrate-level conductive fingers 154 that are in ohmic contact with the n-type regions 108 and second lower level through-vias 150 that extend between the second substrate-level conductive fingers 154 and the second lower-level conductive fingers 128.

The semiconductor device 100 of FIG. 4 can have a plan-view configuration according to any of the embodiments described with reference to FIGS. 1, 2 and 3, with the portion of the interconnection region 115 below the second level metallization layer 117 being additionally included in the device. Thus, the semiconductor device 100 of FIG. 4 can be configured such that the first upper-level metal fingers 116 are at least partially non-overlapping with the second upper-level metal fingers 118 in the first lateral direction LD1 in the connection area 142. Moreover, semiconductor device 100 of FIG. 4 can be configured such that the first through-via area 144 is non-overlapping with the second through-via area 146 in the first lateral direction LD1.

Other embodiments of the semiconductor device 100 include the following. The interconnection region 115 may comprise three or more metallization layers 117 on different vertical levels. Separately or in combination, the non-overlapping arrangement of the first through-via area 144 and the second through-via area 146 may be provided by through-vias that extend between any two levels of the interconnection region 115. Separately or in combination, the metallization layer 117 that the first and second upper-level metal fingers 116, 118 are formed in can be at least two levels apart from the metallization layer 117 or substrate level interconnect layer 121 that the first and second low-level metal fingers 124, 128 are formed in.

Although the present disclosure is not so limited, the following numbered examples demonstrate one or more aspects of the disclosure.

Example 1. A semiconductor device, comprising: a semiconductor body comprising an upper surface; a group of first lower-level conductive fingers and second lower-level conductive fingers that disposed on or above the upper surface and are arranged alternatingly with one another in a first lateral direction and; and a group of first upper-level metal fingers and second upper-level metal fingers that are arranged alternatingly with one another in the first lateral direction, wherein each of the first upper-level metal fingers is electrically connected to the semiconductor body by first vertical connectors that comprise one of the first lower-level conductive fingers, wherein each of the second upper-level metal fingers is electrically connected to the semiconductor body by second vertical connectors that comprise one of the second lower-level conductive fingers, wherein the group of first lower-level conductive fingers and second lower-level conductive fingers defines a connection area over the upper surface, and wherein in the connection area the first upper-level metal fingers are at least partially non-overlapping with the second upper-level metal fingers in the first lateral direction.

Example 2. The semiconductor device of example 1, wherein in the connection area the first upper-level metal fingers are completely non-overlapping with the first upper-level metal fingers in the first lateral direction.

Example 3. The semiconductor device of example 1, wherein in the connection area the first upper-level metal fingers are partially non-overlapping with the first upper-level metal fingers in the first lateral direction.

Example 4. The semiconductor device of example 3, wherein an overlap ratio of the first upper-level and second metal fingers is no more than 25%, the overlap ratio being a ratio between a combined length of the first upper-level metal fingers that overlap with the second upper-level metal fingers in the connection area and a combined length of the first upper-level metal fingers that do not overlap with the second upper-level metal fingers in the connection area.

Example 5. The semiconductor device of example 4, wherein in the connection area the overlap ratio of the first upper-level and second metal fingers is no more than 10%.

Example 6. The semiconductor device of example 1, wherein the first vertical connectors comprise first through-vias that are in ohmic contact with the first upper-level metal fingers, and wherein the second vertical connectors comprise second through-vias that are in ohmic contact with the second upper-level metal fingers.

Example 7. The semiconductor device of example 6, wherein all of the first though-vias in the connection area are confined within a first through-via area, wherein all of the second though-vias in the connection area are confined within a second through-via area, and wherein the first through-via area is non-overlapping with the second through-via area in the first lateral direction LD1.

Example 8. The semiconductor device of example 1, wherein in the connection area the first upper-level metal fingers are partially non-overlapping with the first lower-level conductive fingers in a second lateral direction and the second upper-level metal fingers are partially non-overlapping with the second lower-level conductive fingers in the second lateral direction, wherein the second lateral direction is orthogonal to the first lateral direction.

Example 9. The semiconductor device of example 1, wherein the semiconductor body comprises a group of p-type regions and n-type regions that are disposed within the semiconductor body and are arranged alternatingly with one another in the first lateral direction, wherein each of the first upper-level metal fingers is electrically connected to one of the p-type regions by the first vertical connectors, and wherein each of the second upper-level metal fingers is electrically connected to one of the n-type regions by the second vertical connectors Example 10. The semiconductor device of example 1, wherein the first lower-level conductive fingers are disposed directly on the upper surface of the semiconductor body and are each in ohmic contact with one of the p-type regions, and wherein the second lower-level conductive fingers are disposed directly on the upper surface of the semiconductor body and are each in ohmic contact with one of the n-type regions.

Example 11. The semiconductor device of example 1, further comprising an interconnection region disposed on the upper surface, wherein the interconnection region comprises one or more structured metallization layers and a dielectric region arranged between the one or more structured metallization layers and the upper surface, wherein the group of first upper-level metal fingers and second upper-level metal fingers is formed in one of the structured metallization layers.

Example 12. The semiconductor device of example 11, wherein the one or more structured metallization layers comprises a second level metallization and a third level metallization, wherein the group of first upper-level metal fingers and second upper-level metal fingers is formed in the third level metallization, and wherein the group of first lower-level conductive fingers and second lower-level conductive fingers is formed in the second level metallization.

Example 13. The semiconductor device of example 11, further comprising first and second bond pads formed in an uppermost one of the structured metallization layers, wherein the semiconductor device is configured as a rectifier device between the first and second bond pads.

Example 14. The semiconductor device of example 13, wherein the semiconductor device is configured as a bidirectional silicon-controlled rectifier device between the first and second bond pads.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor device, comprising:
a semiconductor body comprising an upper surface;
a group of first lower-level conductive fingers and second lower-level conductive fingers that are disposed on or above the upper surface and are arranged alternatingly with one another in a first lateral direction and; and
a group of first upper-level metal fingers and second upper-level metal fingers that are arranged alternatingly with one another in the first lateral direction,
wherein each of the first upper-level metal fingers is electrically connected to the semiconductor body by first vertical connectors that comprise one of the first lower-level conductive fingers,
wherein each of the second upper-level metal fingers is electrically connected to the semiconductor body by second vertical connectors that comprise one of the second lower-level conductive fingers,
wherein the group of first lower-level conductive fingers and second lower-level conductive fingers defines a connection area over the upper surface, and
wherein in the connection area the first upper-level metal fingers are completely non-overlapping with the second upper-level metal fingers in the first lateral direction.

2. The semiconductor device of claim 1, wherein in the connection area the first upper-level metal fingers are partially non-overlapping with the first lower-level conductive fingers in a second lateral direction and the second upper-level metal fingers are partially non-overlapping with the second lower-level conductive fingers in the second lateral direction, wherein the second lateral direction is orthogonal to the first lateral direction.

3. The semiconductor device of claim 1, wherein the semiconductor body comprises a group of p-type regions and n-type regions that are disposed within the semiconductor body and are arranged alternatingly with one another in the first lateral direction, wherein each of the first upper-level metal fingers is electrically connected to one of the p-type regions by the first vertical connectors, and wherein each of the second upper-level metal fingers is electrically connected to one of the n-type regions by the second vertical connectors.

4. The semiconductor device of claim 3, wherein the first lower-level conductive fingers are disposed directly on the upper surface of the semiconductor body and are each in ohmic contact with one of the p-type regions, and wherein the second lower-level conductive fingers are disposed directly on the upper surface of the semiconductor body and are each in ohmic contact with one of the n-type regions.

5. The semiconductor device of claim 1, further comprising an interconnection region disposed on the upper surface, wherein the interconnection region comprises one or more structured metallization layers and a dielectric region arranged between the one or more structured metallization layers and the upper surface, wherein the group of first upper-level metal fingers and second upper-level metal fingers is formed in one of the structured metallization layers.

6. The semiconductor device of claim 5, wherein the one or more structured metallization layers comprises a second level metallization and a third level metallization, wherein the group of first upper-level metal fingers and second upper-level metal fingers is formed in the third level metallization, and wherein the group of first lower-level conductive fingers and second lower-level conductive fingers is formed in the second level metallization.

7. The semiconductor device of claim 5, further comprising first and second bond pads formed in an uppermost one of the structured metallization layers, wherein the semiconductor device is configured as a rectifier device between the first and second bond pads.

8. The semiconductor device of claim 7, wherein the semiconductor device is configured as a bidirectional silicon-controlled rectifier device between the first and second bond pads.

9. A semiconductor device, comprising:
a semiconductor body comprising an upper surface;
a group of first lower-level conductive fingers and second lower-level conductive fingers that are disposed on or above the upper surface and are arranged alternatingly with one another in a first lateral direction and; and
a group of first upper-level metal fingers and second upper-level metal fingers that are arranged alternatingly with one another in the first lateral direction,
wherein each of the first upper-level metal fingers is electrically connected to the semiconductor body by first vertical connectors that comprise one of the first lower-level conductive fingers,
wherein each of the second upper-level metal fingers is electrically connected to the semiconductor body by second vertical connectors that comprise one of the second lower-level conductive fingers,
wherein the group of first lower-level conductive fingers and second lower-level conductive fingers defines a connection area over the upper surface, and
wherein in the connection area the first upper-level metal fingers are at least partially non-overlapping with the second upper-level metal fingers in the first lateral direction,
wherein the first vertical connectors comprise first through-vias that are in ohmic contact with the first upper-level metal fingers, and wherein the second vertical connectors comprise second through-vias that are in ohmic contact with the second upper-level metal fingers,
wherein all of the first though-vias in the connection area are confined within a first through-via area, wherein all of the second though-vias in the connection area are confined within a second through-via area, and wherein the first through-via area is non-overlapping with the second through-via area in the first lateral direction.

10. A semiconductor device, comprising:
a semiconductor body comprising an upper surface;
a group of first lower-level conductive fingers and second lower-level conductive fingers that are disposed on or above the upper surface and are arranged alternatingly with one another in a first lateral direction and; and
a group of first upper-level metal fingers and second upper-level metal fingers that are arranged alternatingly with one another in the first lateral direction,
wherein each of the first upper-level metal fingers is electrically connected to the semiconductor body by first vertical connectors that comprise one of the first lower-level conductive fingers,
wherein each of the second upper-level metal fingers is electrically connected to the semiconductor body by second vertical connectors that comprise one of the second lower-level conductive fingers,
wherein the group of first lower-level conductive fingers and second lower-level conductive fingers defines a connection area over the upper surface, and
wherein in the connection area the first upper-level metal fingers are at least partially non-overlapping with the second upper-level metal fingers in the first lateral direction,
wherein the semiconductor body comprises a group of p-type regions and n-type regions that are disposed within the semiconductor body and are arranged alternatingly with one another in the first lateral direction, wherein each of the first upper-level metal fingers is electrically connected to one of the p-type regions by the first vertical connectors, and wherein each of the second upper-level metal fingers is electrically connected to one of the n-type regions by the second vertical connectors,
wherein the first lower-level conductive fingers are disposed directly on the upper surface of the semiconductor body and are each in ohmic contact with one of the p-type regions, and wherein the second lower-level conductive fingers are disposed directly on the upper surface of the semiconductor body and are each in ohmic contact with one of the n-type regions.

11. The semiconductor device of claim 10, wherein in the connection area the first upper-level metal fingers are partially non-overlapping with the first upper-level metal fingers in the first lateral direction.

12. The semiconductor device of claim 11, wherein an overlap ratio of the first upper-level and second metal fingers is no more than 25%, the overlap ratio being a ratio between a combined length of the first upper-level metal fingers that overlap with the second upper-level metal fingers in the connection area and a combined length of the first upper-level metal fingers that do not overlap with the second upper-level metal fingers in the connection area.

13. The semiconductor device of claim 12, wherein in the connection area the overlap ratio of the first upper-level and second metal fingers is no more than 10%.

* * * * *